US008293617B2

(12) United States Patent
McGinnis et al.

(10) Patent No.: US 8,293,617 B2
(45) Date of Patent: *Oct. 23, 2012

(54) GAP PROCESSING

(75) Inventors: Arthur J. McGinnis, Boise, ID (US); Sachin Joshi, Boise, ID (US); Chan Lim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/282,563

(22) Filed: Oct. 27, 2011

(65) Prior Publication Data

US 2012/0040534 A1 Feb. 16, 2012

Related U.S. Application Data

(63) Continuation of application No. 12/175,200, filed on Jul. 17, 2008, now Pat. No. 8,058,138.

(51) Int. Cl.
*H01L 21/76* (2006.01)

(52) U.S. Cl. ........ 438/422; 438/421; 438/424; 438/614; 257/E21.463; 257/E21.681

(58) Field of Classification Search .................. 438/422, 438/421, 614, 424; 257/E21.463, E21.581
See application file for complete search history.

(56) References Cited

U.S. PATENT DOCUMENTS

| 5,204,141 | A | * | 4/1993 | Roberts et al. ........... 427/255.37 |
| 5,759,913 | A | | 6/1998 | Fulford, Jr. et al. |
| 5,976,991 | A | * | 11/1999 | Laxman et al. ............... 438/786 |
| 6,081,033 | A | | 6/2000 | Clampitt |
| 6,091,150 | A | | 7/2000 | Sandhu et al. |
| 6,413,855 | B2 | | 7/2002 | Clampitt |
| 6,432,813 | B1 | | 8/2002 | Sandhu et al. |
| 6,781,192 | B2 | | 8/2004 | Farrar |
| 7,091,611 | B2 | | 8/2006 | Ahn et al. |
| 2002/0079557 | A1 | | 6/2002 | Ahn et al. |
| 2003/0161951 | A1 | | 8/2003 | Yuan et al. |
| 2004/0097013 | A1 | | 5/2004 | Lur et al. |
| 2005/0260864 | A1 | | 11/2005 | Huang et al. |
| 2005/0263896 | A1 | | 12/2005 | Lur et al. |
| 2007/0020850 | A1 | | 1/2007 | Takaishi |
| 2008/0135917 | A1 | | 6/2008 | Dong et al. |

OTHER PUBLICATIONS

Spitzmüller, "Thermal decomposition of tetraethoxysilane (TEOS) on Si (111)-(7×7)," Appl. Phys. A 66, S1021-S1024 (1998).*
Tsukamoto, Keisuke, Advanced Air Gap Process for Multi-Level Cell Flash Memories Reducing Threshold Voltage Interference and Realizing High Reliability, Jpn. J. Appl. Phys., vol. 46, No. 4B, pp. 2184-2187 (2007).

* cited by examiner

*Primary Examiner* — Julia Slutsker
(74) *Attorney, Agent, or Firm* — Brooks, Cameron & Huebsch, PLLC

(57) ABSTRACT

Among various methods, devices, and apparatuses, a number of methods are provided for forming a gap between circuitry. One such method includes depositing a first oxide precursor material on at least two conductive lines having at least one gap between the at least two conductive lines, and forming a breadloaf configuration with the first oxide precursor material on a top of each of the at least two conductive lines that leaves a space between a closest approach of at least two adjacent breadloaf configurations. The method also includes depositing a second oxide precursor material over the first oxide precursor material, where depositing the second oxide precursor material results in closing the space between the closest approach of the at least two adjacent breadloaf configurations.

26 Claims, 11 Drawing Sheets

```
                                                          ┌1094
┌─────────────────────────────────────────────────────────┴──┐
│ DEPOSITING A FIRST OXIDE PRECURSOR MATERIAL ON AT LEAST TWO CONDUCTIVE │
│ LINES HAVING AT LEAST ONE GAP BETWEEN THE AT LEAST TWO CONDUCTIVE LINES │
└────────────────────────────┬────────────────────────────────┘
                             │                            ┌1096
┌────────────────────────────┴────────────────────────────┴──┐
│ FORMING A BREADLOAF CONFIGURATION WITH THE FIRST OXIDE PRECURSOR MATERIAL │
│ ON A TOP OF EACH OF THE AT LEAST TWO CONDUCTIVE LINES THAT LEAVES A SPACE │
│   BETWEEN A CLOSEST APPROACH OF AT LEAST TWO ADJACENT BREADLOAF          │
│                         CONFIGURATIONS                                   │
└────────────────────────────┬────────────────────────────────┘
                             │                            ┌1098
┌────────────────────────────┴────────────────────────────┴──┐
│ DEPOSITING A SECOND OXIDE PRECURSOR MATERIAL OVER THE FIRST OXIDE │
│ PRECURSOR MATERIAL, WHEREIN DEPOSITING THE SECOND OXIDE PRECURSOR │
│ MATERIAL RESULTS IN CLOSING THE SPACE BETWEEN THE CLOSEST APPROACH OF THE │
│       AT LEAST TWO ADJACENT BREADLOAF CONFIGURATIONS              │
└─────────────────────────────────────────────────────────────┘
```

*Fig. 10*

GAP PROCESSING

PRIORITY APPLICATION INFORMATION

This application is a Continuation of U.S. patent application Ser. No. 12/175,200, filed Jul. 17, 2008, the specification of which is incorporated herein by reference.

TECHNICAL FIELD

The present disclosure relates to the field of semiconductor integrated circuits and, in particular, to an improved method for making gaps for isolation.

BACKGROUND

In modern semiconductor device applications, numerous components are packed onto a single small area, for instance, on a semiconductor substrate, to create an integrated circuit. For the circuit to function, many of these individual components may need to be electrically isolated from one another. Accordingly, electrical isolation is an important and integral part of integrated circuit design for preventing the unwanted electrical coupling between adjacent components and devices.

As the size of integrated circuits is reduced, the components and devices that make up the circuits must be positioned closer together in order to comply with the limited space available. As the industry strives towards a greater density of active components per unit area, effective isolation between circuit components becomes all the more important.

Isolating circuit components in modern integrated circuit technology may take the form of gap structures positioned between such circuit components. For instance, air gaps may contribute to isolation of interconnect lines that supply electrical power to various devices forming part of, or connected to, the integrated circuit. To further contribute to such isolation, a dielectric material may be deposited on the sidewalls and bottom of the gaps. In some instances, an oxide precursor material may be deposited over the top of interconnect lines and into the intervening gaps between the interconnect lines, which may be converted into an oxide having dielectric properties, such as silicon dioxide, by subsequent exposure, for instance, to oxygen.

As the density of components on the integrated circuit increases, the widths of certain components sometimes decreases, leading to increasing the height of such components to maintain a cross-sectional area adequate for desired current flow, such as in interconnect lines. To maintain isolation of such components from each other, for instance, intervening air gap structures correspondingly may increase in depth while also decreasing in width until the process of forming a dielectric oxide from the oxide precursor material on the bottom and sidewalls of the air gaps develops problems.

Constrictions may develop due to a narrow opening at the top of a gap, which may be exacerbated by depth of the gap, as the oxide precursor material is deposited around the two upper edges of the gap. Such constrictions may reduce exposure of the oxide precursor material at the bottom and adjacent sidewalls of, for instance, an air gap to a subsequent condition intended to convert the oxide precursor material to an effective dielectric oxide. For instance, inadequate exposure of a silicon-containing compound to oxygen may contribute to a silicon-rich mixture at the bottom and adjacent sidewalls of an air gap that has a high dielectric constant relative to the intended dielectric constant of a more uniform silicon dioxide.

As such, premature closing at the top of an air gap may reduce formation of an intended substantially uniform dielectric oxide layer at the bottom and adjacent sidewalls of the air gap. Hence, an effective dielectric constant of the resultant oxide mixture at the bottom and adjacent sidewalls of the air gap may be increased so as to reduce isolation of the components of the integrated circuit, such as neighboring interconnect lines.

BRIEF DESCRIPTION OF THE DRAWINGS

FIG. 10 is a block diagram illustrating forming an air gap between circuitry according to method embodiments of the present disclosure.

DETAILED DESCRIPTION OF THE DISCLOSURE

Figure 1:
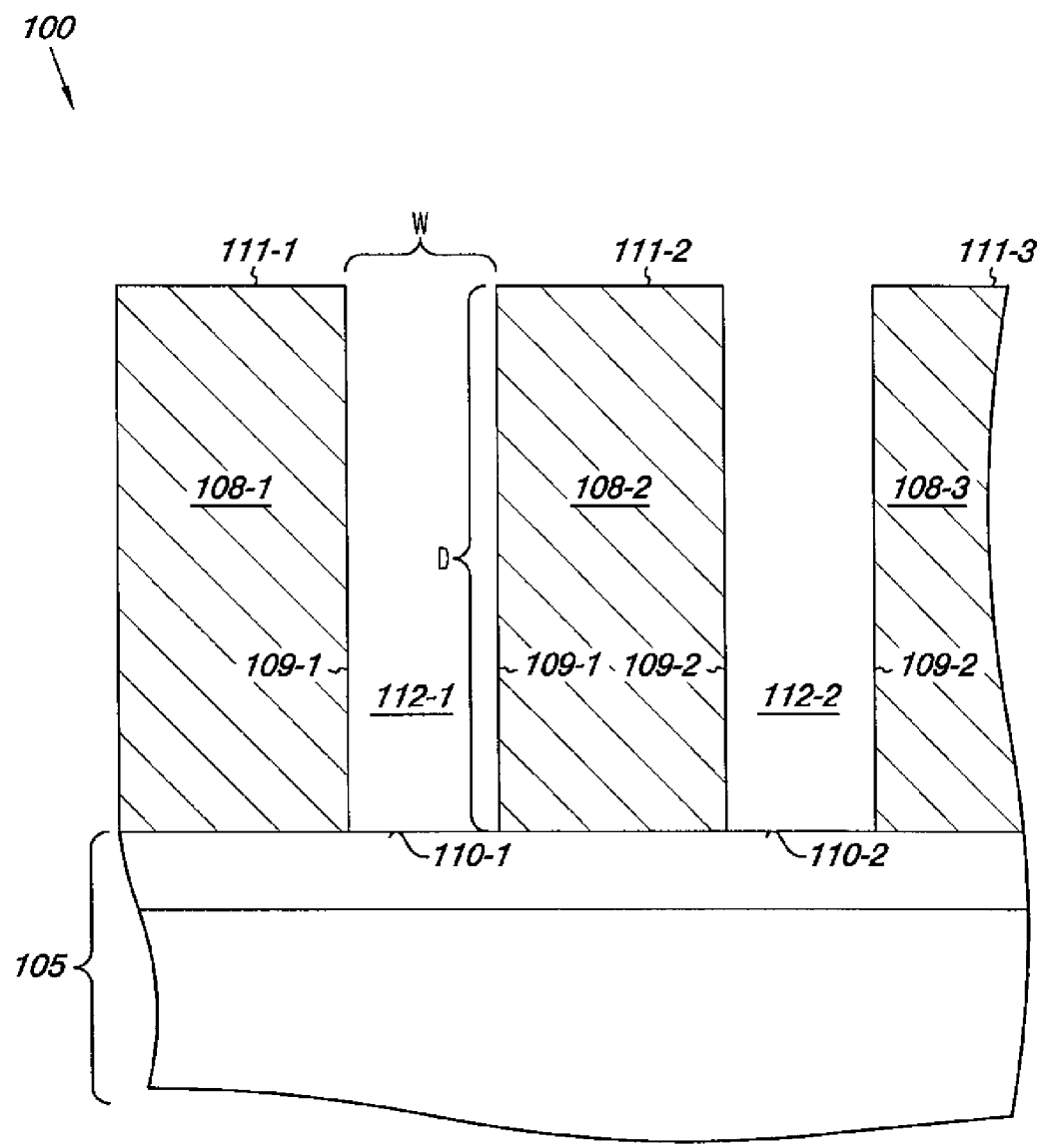
FIG. 1 illustrates a schematic cross-sectional view of a representative air gap structure.

Among various methods, devices, and apparatuses, a number of methods are provided for operating a chemical vapor deposition reactor to form a gap between circuitry. One such method includes depositing a non-conformal first oxide precursor material using plasma-enhanced chemical vapor deposition on at least two conductive lines having at least one gap between the at least two conductive lines, where each conductive line has a top and at least one sidewall and each gap has a bottom of a particular depth separating sidewalls of the two conductive lines. Such a method can include forming a breadloaf configuration with the non-conformal first oxide precursor material on a top of each of the at least two conductive lines that leaves a space between the closest approach of adjacent breadloaf configurations. The method also can include depositing a conformal second oxide precursor material on the at least two conductive lines, where depositing the second oxide precursor material results in closing the space between the closest approach of the at least two adjacent breadloaf configurations.

The present disclosure provides a number of embodiments of improved processes of forming gap structures. Although, for example, air gap structures have been used to isolate circuit components (e.g., in an integrated circuit formed on a semiconductor substrate), dielectric deposition (e.g., with silicon dioxide) in the air gap to further increase the relative dielectric constant has sometimes presented problems, contributed to, at least in part, by the decreasing width and/or the increasing depth of such air gaps in modern circuitry.

Precursors of dielectric materials may be deposited in and around air gaps with conversion to, for instance, a dielectric oxide using various instrumentalities for chemical vapor deposition (CVD) and/or exposure to an environs with elevated temperature. Such instrumentalities may use various techniques such as high-density plasma chemical vapor deposition (HDP-CVD), plasma-enhanced chemical vapor deposition (PECVD), in situ steam generation (ISSG), furnace annealing, and furnace oxide deposition, among others.

During deposition of the dielectric precursor material, such dielectric precursor material may collect near the top edges of the air gap (e.g., overhanging the tops of adjacent interconnect lines) and along the adjacent sidewalls of the air gap (especially when using a non-conformal dielectric precursor). Such a deposition pattern may result in a "breadloaf" configuration that constricts or closes the top opening of the air gap before all of such precursor material (e.g., an oxide precursor material) can be sufficiently exposed to conditions in the environs that enable adequate conversion of the precursor into a substantially uniform layer of the intended dielectric (e.g., an oxide such as silicon dioxide). For instance, a non-conformal oxide precursor (e.g., silane) may be deposited in order to allow the top of the air gap to be closed before a comparable amount of the precursor is deposited in further depths of the air gap.

However, because such a non-conformal oxide precursor sometimes is exposed to oxygen-containing gases, or other materials, to enable conversion to the intended oxide, closing the opening of the top of the air gap may prevent adequate exposure of precursor material having penetrated the depths of the air gap to the condition enabling uniform conversion to the intended dielectric. As precursors become more non-conformal, progressively less precursor material and resultant dielectric oxide is deposited near the bottom and adjacent sidewalls of the air gap.

Such a decrease in precursor and dielectric being deposited in the interior of the air gap may improve void formation and lead to lower capacitance (i.e., because a vacuum has the lowest relative dielectric constant of 1.0). However, some amount of dielectric precursor deposition around the bottom and adjacent sidewalls of an air gap is common using a CVD procedure. Closing the top opening of the air gap before precursor deposited near the bottom and adjacent sidewalls of the air gap is adequately exposed to conditions provided by the surrounding environs of the CVD reactor may reduce such exposure so as to prevent conversion of the precursor to the intended dielectric layer.

For instance, not allowing adequate exposure of a non-conformal oxide precursor (e.g., silane $SiH_4$) to a source of oxygen may result in non-uniform conversion of the oxide precursor to an intended dielectric oxide (e.g., silicon dioxide $SiO_2$), thus yielding a silicon-rich (e.g., Si-rich) mixture with varying stoichiometries (e.g., $SiO_x$). A non-uniform dielectric layer including Si-rich portions may result in such portions of the dielectric layer having high relative dielectric constants, thereby providing a film that is "leaky" to electrical current.

Hence, as described in the present disclosure, techniques that reduce a probability of an opening at the top of an air gap closing too soon and/or improve a probability of adequately exposing a dielectric precursor to conditions promoting uniform conversion of the dielectric precursor represent improvements in air gap processing. In some embodiments, forming an air gap between circuitry can, in various embodiments, include depositing a first oxide precursor material on at least two conductive lines having at least one gap between the at least two conductive lines, and forming a breadloaf configuration with the first oxide precursor material on a top of each of the at least two conductive lines that leaves a space between a closest approach of at least two adjacent breadloaf configurations. Such a method also can include depositing a second oxide precursor material over the first oxide precursor material, where depositing the second oxide precursor material results in closing the space between the closest approach of the at least two adjacent breadloaf configurations.

FIG. 1 illustrates a schematic cross sectional view of a representative air gap structure. A structure 100 as illustrated in FIG. 1 can, in some embodiments of the present disclosure, represent an integrated circuit assembly positioned on a semiconductor substrate 105, which can have a number of layers that include various conductors, semiconductors, insulators, dielectrics, etc. Such a structure 100 can, for example, include a number of interconnect lines 108-1, 108-2, 108-3 on top of the semiconductor substrate 105 that can provide electrical power connections to various components and/or devices associated with the integrated circuit. FIGS. 1-6 each can represent an end view of a cut of the integrated circuit such that lengths of the interconnect lines 108-1, 108-2, 108-3 run perpendicular to the plane, as illustrated in FIG. 1.

As used herein, the terms "semiconductor substrate" and "semiconductive substrate" are intended to denote any construction having semiconductive material, which, by way of example and not by way limitation, can include bulk semiconductive materials such as a semiconductive wafer (e.g., alone or in assemblies including other materials thereon), and semiconductive material layers (e.g., alone or in assemblies including other materials). As also used herein, the term "substrate" refers to any supporting structure, which, by way of example and not by way of limitation, can include the semiconductive substrates described in the present disclosure.

In addition, the term "substrate", as used in the present disclosure, can, in some embodiments, include any semiconductor-based structure that has an exposed silicon surface. Such structures can include silicon-on insulator (SOI), silicon-on sapphire (SOS), doped and undoped semiconductors, and/or epitaxial layers of silicon supported by a base semiconductor foundation, among other semiconductor structures. In some substrate embodiments, the semiconductor need not be silicon-based. The semiconductor can, in various embodiments, be silicon-germanium, germanium, and/or gallium-arsenide, among other compounds. When reference is made to a substrate herein, previous unspecified process steps may have been utilized to form regions or junctions in the base semiconductor and/or foundation.

Additionally, "substrate" or "substrate assembly," as used herein, can refer to a semiconductor substrate such as a base semiconductor layer or a semiconductor substrate having one or more layers, structures, or regions formed thereon. A base semiconductor layer may be the underlying layer of silicon material on a wafer or a silicon layer deposited on another material, such as silicon on sapphire or silicon on insulator, among other examples.

"Layer" as used herein can refer to a layer formed on a substrate using a deposition process. The term "layer" is meant to include layers specific to the semiconductor industry, such as "barrier layer," "dielectric layer," and "conductive layer." (The term "layer" is synonymous with the term "film" frequently used in the semiconductor industry). The term "layer" is also meant to include layers found in technology outside of semiconductor technology, such as coatings on glass. In the context of this document, the term "layer" encompasses both the singular and the plural unless otherwise indicated.

The figures presented herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As further used herein, the term "layer" encompasses both the singular and the plural unless otherwise indicated.

As illustrated in FIG. 1, each interconnect line 108-1, 108-2, 108-3 has a thickness allowing each to project a particular distance above the semiconductor substrate 105 and each is separated from an adjacent interconnect line on one or both sides by a particular width (W). As such, an adjacent pair of interconnect lines 108-1, 108-2 can have a pair of opposing sidewalls 109-1 separated at a bottom 110-1 of the pair of opposing sidewalls 109-1, which can, in some embodiments, be an upper surface of the semiconductor substrate 105, and at a top 111-1, 111-2 of the pair of opposing sidewalls 109-1 by the particular W to form an air gap 112-1.

In some embodiments, a width separating sidewalls at a top of an air gap can differ from a width separating sidewalls at a bottom of the air gap. In some embodiments, the top of the air gap can also represent the tops 111-1, 111-2 of the adjacent interconnect lines 108-1, 108-2, at least before having a dielectric precursor material deposited thereon.

As illustrated in FIG. 1, separating the pair of opposing sidewalls 109-1 of the interconnect lines 108-1, 108-2 by a distance W at the bottom 110-1 and the top 111-1, 111-2 can form an air gap 112-1 having a particular depth (D). In various embodiments, multiple interconnect lines can be included in an integrated circuit. By way of example and not by way of limitation, a third interconnect line 108-3 is illustrated on top of the semiconductor substrate 105. Positioning the third interconnect line 108-3 adjacent the second interconnect line 108-2 can provide a second pair of opposing sidewalls 109-2 separated by a particular width at a bottom 110-2 and between tops 111-2, 111-3, in some embodiments, of the interconnect lines 108-2, 108-3 so as to form a second air gap 112-1 with a particular depth. In some embodiments, widths and depths of additional air gaps (e.g., air gap 112-2) can differ from the W and the D illustrated in association with the air gap 112-1.

Figure 2A:
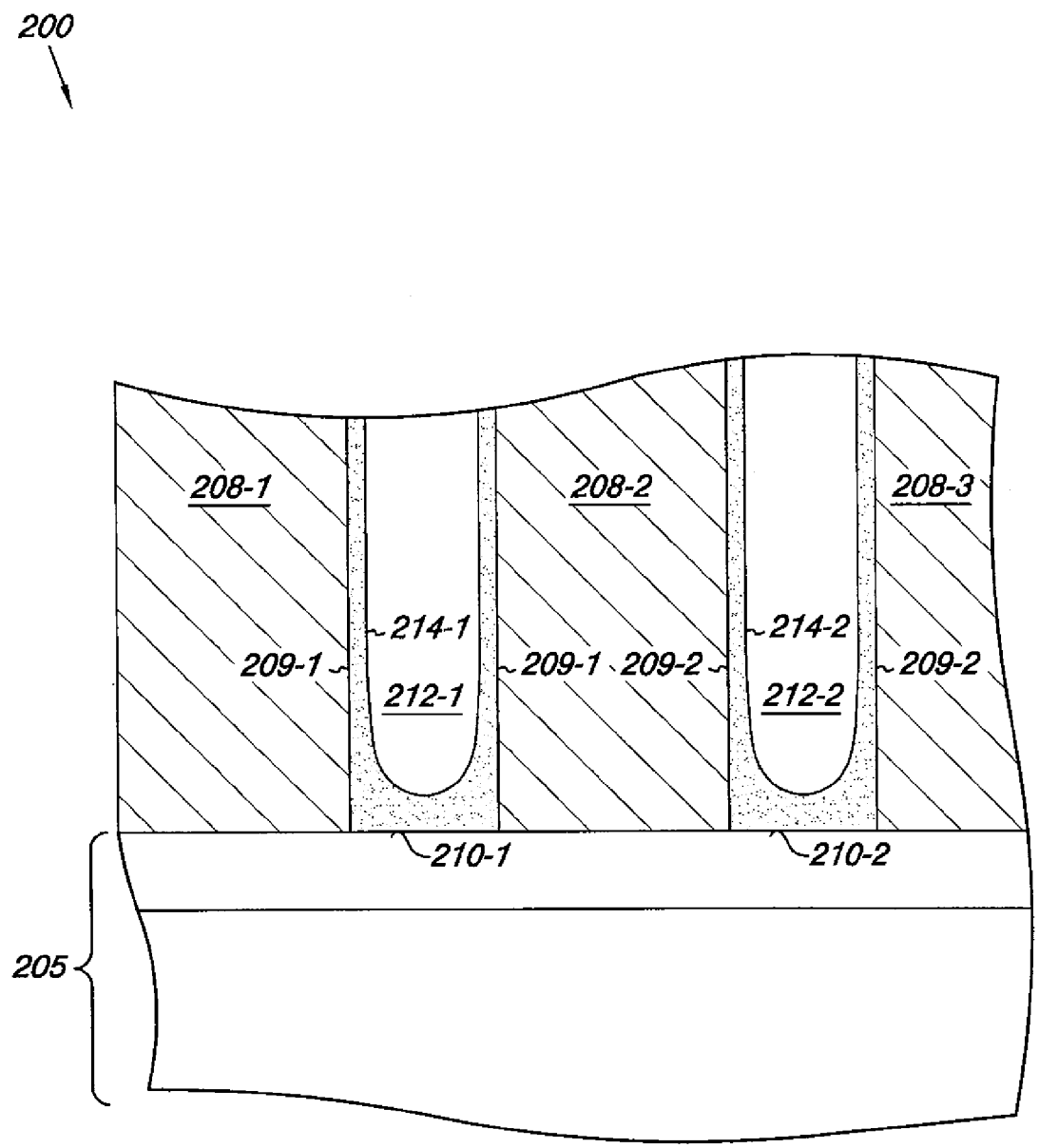
FIG. 2A illustrates a representative cross-sectional view of an oxide configuration resulting from deposition of a conformal oxide precursor at a bottom and adjacent sidewalls of an air gap structure, such as the air gap structure illustrated in FIG. 1.

FIG. 2A illustrates a representative cross-sectional view of an oxide configuration resulting from deposition of a conformal oxide precursor at a bottom and adjacent sidewalls of an air gap structure, such as the air gap structure illustrated in FIG. 1. Embodiments consistent with the present disclosure can utilize deposition of dielectric precursor materials of various types and are not limited to a particular chemical configuration. However, in the interest of clarity and specificity in description of stoichiometric changes, as described in the present disclosure, a "dielectric precursor material" may be described as an "oxide precursor material", where such terms may be used interchangeably. Similarly, following a change in stoichiometry, a resulting "dielectric material" may be described as an "oxide material".

As will be appreciated by one of ordinary skill in the relevant art, a conformal oxide precursor material tends, when deposited on a topology having varying heights, depths, peaks, valleys, etc., to form a deposited layer having a relatively uniform thickness in various locations. For example, tetraethyl orthosilicate (TEOS) can be deposited (e.g., by CVD) in a relatively uniform thickness in various locations and converted at elevated temperatures to an oxide material (e.g., silicon dioxide) also with a relatively uniform thickness in various locations that serves as a dielectric material.

FIG. 2A illustrates a structure 200 that, in various embodiments, can have positioned upon a substrate 205 (e.g., a semiconductor substrate as described herein) a number elevated components 208-1, 208-2, 208-3 (e.g., interconnect lines). For example, lower portions of interconnect lines 208-1 and 208-2 can have a pair of opposing sidewalls 209-1 and a bottom 210-1 (e.g., on the upper surface of the substrate 205) that enable formation of a lower portion of an air gap 212-1.

When a conformal oxide precursor 214-1 (e.g., TEOS) is deposited on the structure 200, some of the conformal oxide precursor 214-1 can penetrate the bottom portion of the air gap 212-1 so as to form a relatively uniform thickness along the length of the pair of sidewalls 209-1 and the bottom 210-1 forming a contour of the air gap 212-1. In some situations, as illustrated in FIG. 2A, a greater thickness of conformal oxide material 214-1 may accumulate in the corners on both sides of the air gap 212-1. Additionally, a second pair of elevated components 208-2, 208-3 on the substrate 205 can have a lower portion of a second pair of opposing sidewalls 209-2 separated by a bottom 210-2 of a second air gap 212-2 having a continuation of the oxide precursor material 214-2 layer deposited thereon.

Figure 2B:
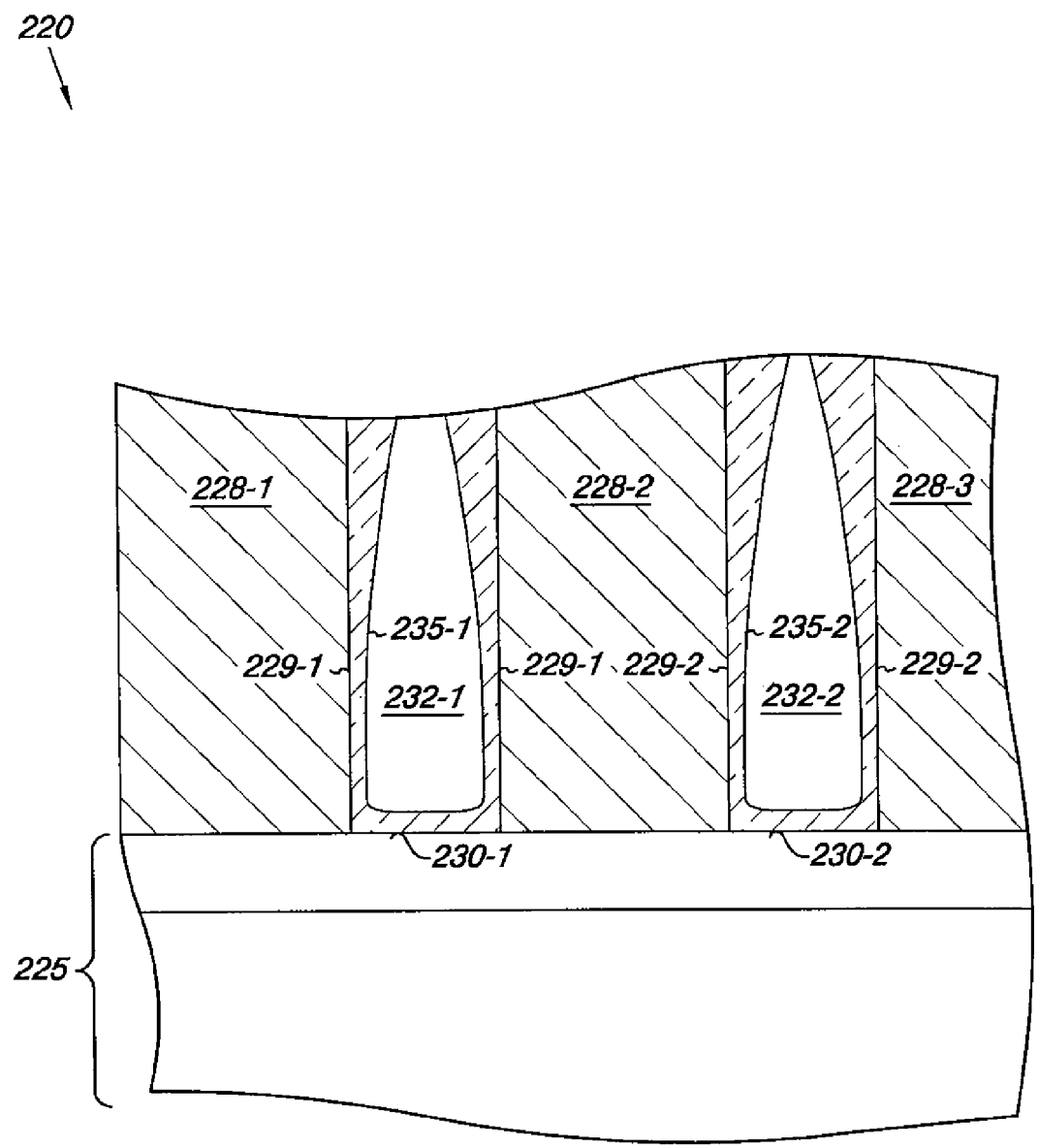
FIG. 2B illustrates a representative cross-sectional view of an oxide configuration resulting from deposition of a non-conformal oxide precursor at a bottom and adjacent sidewalls of an air gap structure, such as the air gap structure illustrated in FIG. 1.

FIG. 2B illustrates a representative cross-sectional view of an oxide configuration resulting from deposition of a non-conformal oxide precursor at a bottom and adjacent sidewalls of an air gap structure, such as the air gap structure illustrated in FIG. 1. As will be appreciated by one of ordinary skill in the relevant art, a non-conformal oxide precursor material tends, when deposited on a topology having varying heights, depths, peaks, valleys, etc., to form a deposited layer having a relatively non-uniform thickness in various locations (e.g., varying in a thickness of deposition between an upper portion an air gap and a lower portion of an air gap).

For example, silane ($SiH_4$) and/or or silane-family compounds ($Si_nH_{2n+2}$) can be deposited (e.g., by CVD) in such a manner as to form a relatively thick layer at and/or around the top of elevated components adjacent the upper portion of an air gap. Further, non-conformal oxide precursors such as silane and/or or silane-family compounds can continue to be deposited in a relatively thick layer in the upper portion of the air gap but with the thickness decreasing as the depth of the air gap lengthens, such that the amount of non-conformal oxide precursor deposited in the lower portion of the air gap can for a thickness that is notably less than the thickness at the upper portion of the air gap. Consequently, the oxide material layer resulting from exposure to oxygen-containing materials and/ or elevated temperatures (e.g., silicon dioxide) can also demonstrate a greater thickness at and around the top of elevated components and into the upper portion of adjacent air gaps on each side of the elevated component such that the non-conformal oxide layer can be termed a "breadloaf" configuration of dielectric material.

FIG. 2B illustrates a structure 220 that, in various embodiments, can have positioned upon a substrate 225 (e.g., a semiconductor substrate as described herein) a number elevated components 228-1, 228-2, 228-3 (e.g., interconnect lines). For example, lower portions of interconnect lines 228-1 and 228-2 can have a pair of opposing sidewalls 229-1 and a bottom 230-1 (e.g., on the upper surface of the substrate 225) that enable formation of a lower portion of an air gap 232-1.

When a non-conformal oxide precursor 235-1 (e.g., silane) is deposited on the structure 220, some of the non-conformal oxide precursor 235-1 can penetrate the bottom portion of the air gap 232-1 so as to form a thickness along the length of the pair of sidewalls 229-1 and the bottom 230-1 forming a contour of the air gap 212-1. In contrast to conformal oxide precursor material (e.g., as illustrated in FIG. 2A), FIG. 2B illustrates that non-conformal oxide precursor material, and resulting oxide material, can form a non-uniform thickness in a lower portion of an air gap when compared to an upper portion of the air gap. Additionally, a second pair of elevated components 228-2, 228-3 on the substrate 225 can have a lower portion of a second pair of opposing sidewalls 229-2 separated by a bottom 230-2 of a second air gap 232-2 having a continuation of the oxide precursor material 235-2 layer deposited thereon. By way of illustration, the upper portion of the non-conformal oxide precursor layer 235-1 in air gap 232-1 and the non-conformal oxide precursor layer 235-2 in air gap 232-2 have thicknesses in the upper portions along each pair of sidewalls 229-1 and 229-2 that decrease as the depths of the air gaps progress toward the bottoms 230-1, 230-2 of the air gaps 232-1, 232-2.

Figure 3:
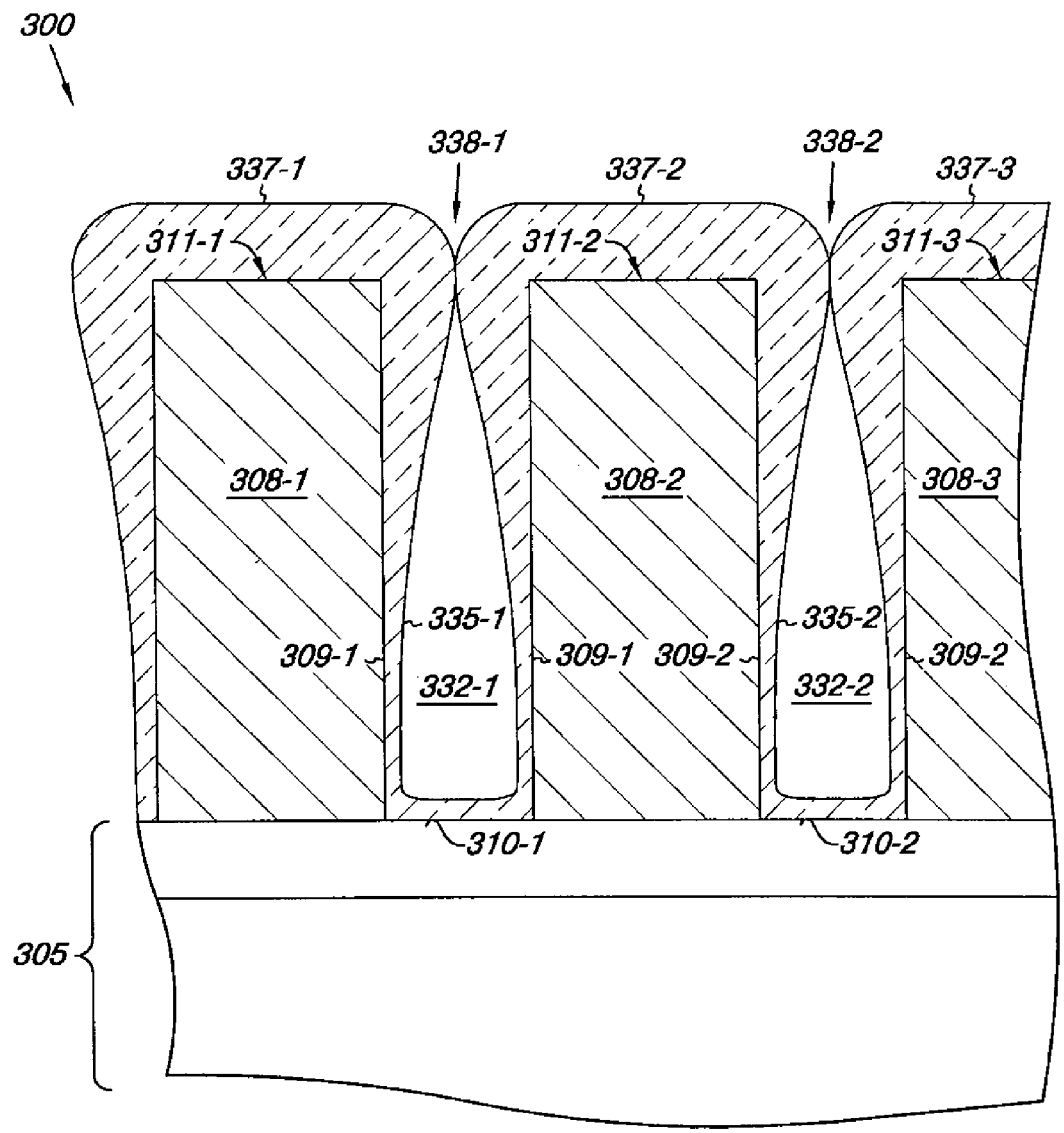
FIG. 3 illustrates a representative cross-sectional view of an air gap structure upon which a non-conformal oxide precursor has been deposited so as to close an opening of the air gap.

FIG. 3 illustrates a representative cross-sectional view of an air gap structure upon which a non-conformal oxide precursor has been deposited so as to close an opening of the air gap. FIG. 3 illustrates a view of a structure 300 that includes elements corresponding to those in the lower portion described with regard to FIG. 2A, upon which a non-conformal oxide precursor material has been deposited, in addition to an upper portion of the structure 300, upon which the non-conformal oxide precursor material also has been deposited.

In particular, FIG. 3 illustrates the top 311-1 of the first elevated component 308-1 positioned on the substrate 305, the top 311-2 of the second elevated component 308-2 positioned on the substrate 305, and the top 311-3 of the third elevated component 308-3 positioned on the substrate 305. Shown on the tops 311-1, 311-2, 311-3 of each of the elevated component 308-1, 308-2, 308-3 are breadloaf configurations 337-1, 337-2, 337-3 formed by deposition of non-conformal oxide precursor 335-1, 335-2. Some of the non-conformal oxide precursor 335-1, 335-2 also is shown to be deposited along the pairs of sidewalls 309-1, 309-2 and bottoms 310-1, 310-2 (e.g., in a manner consistent with that described with regard to FIG. 2B) to form air gaps 332-1, 332-2 between the elevated components 308-1, 308-2, 308-3.

FIG. 3 illustrates that deposition of non-conformal oxide precursor material 335-1, 335-2 on a structure 300 having elevated components 308-1, 308-2, 308-3 with intervening air gaps 332-1, 332-2 can continue until the breadloaf configurations 337-1, 337-2, 337-3 become large enough to form enclosed air gaps 335-1, 335-2 that still have a void therein that is not filled with non-conformal oxide precursor material. That is, deposition of the non-conformal oxide precursor material 335-1, 335-2 can be performed until enough material has been deposited to close what would otherwise have been a space 338-1, 338-2 left between the closest approach of each breadloaf configuration to an adjacent breadloaf configuration 337-1, 337-2, 337-3.

In some situations, however, closing a space at the top of an air gap can reduce interaction of a deposited oxide precursor material with an oxygen-containing material in the environs of the CVD reactor intended to convert the deposited oxide precursor material to an intended oxide dielectric. For example, using silane $SiH_4$ as a non-conformal oxide precursor in a PECVD reactor can result in a Si-rich layer being deposited on a structure. Converting the Si-rich layer to an intended $SiO_2$ dielectric can be accomplished by heating the Si-rich layer in the presence of oxygen-containing gases (e.g., $O_2$, $N_2O$, and/or $CO_2$, among others) and/or by heating the Si-rich layer and having a layer of oxygen-donating material deposited over the Si-rich layer, as described in the present disclosure.

Closing the space at the top of an air gap prematurely can reduce the probability of exposure of each deposited Si-containing molecule to sufficient oxygen containing gases to accomplish uniform conversion to $SiO_2$ or prevent the possibility of subsequent deposition of an oxygen-donating material. Hence, a Si-rich mixture of materials (e.g., $SiO_x$, where x=0, 1, or 2) may remain in the deposited layer, rather than an intended uniform $SiO_2$ dielectric layer. Such a Si-rich oxide layer can have regions that are particularly low in $SiO_2$, which may promote current leakage across an air gap rather than inhibit current leakage as intended by depositing a $SiO_2$ dielectric layer.

Figure 4:
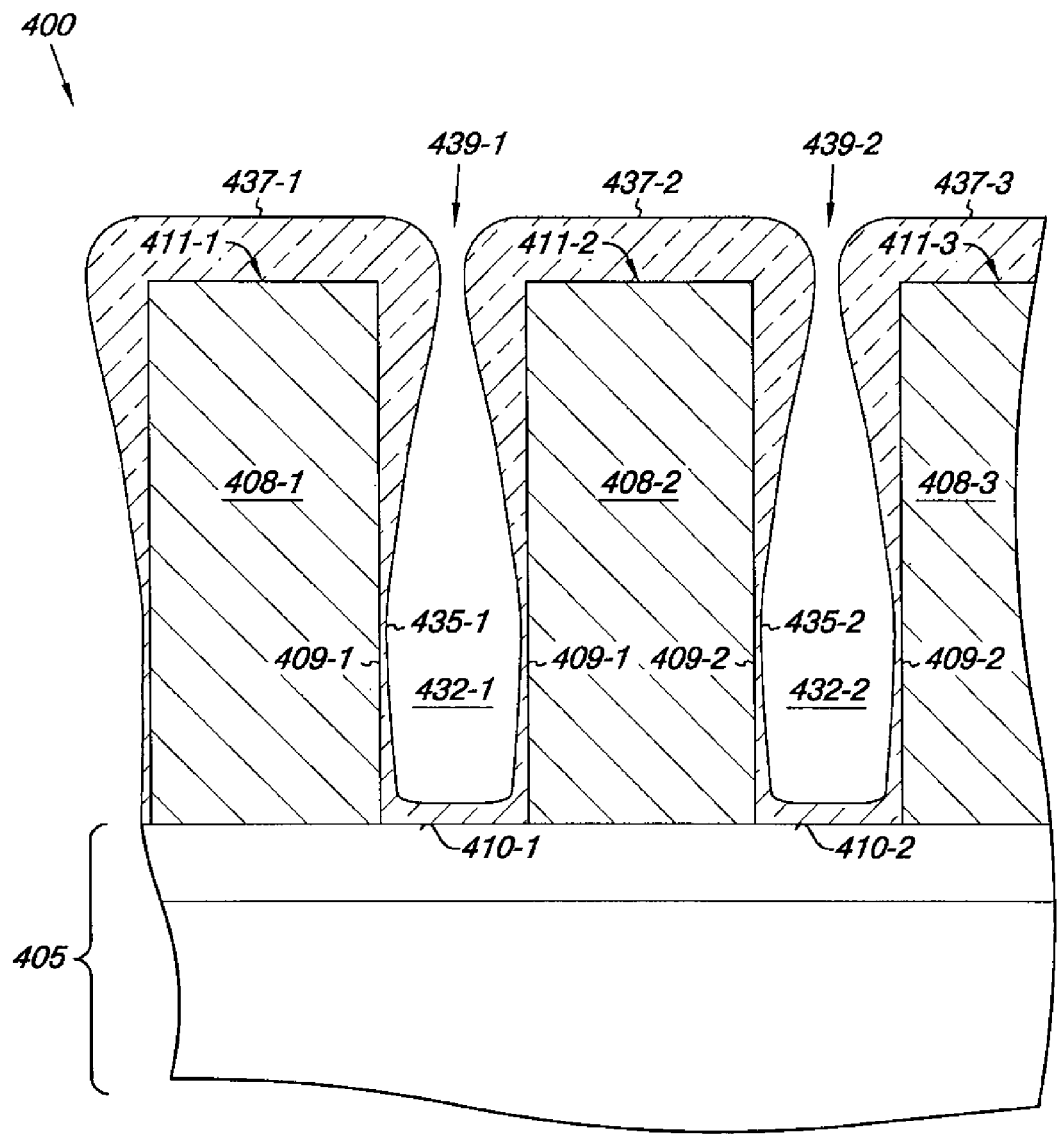
FIG. 4 illustrates a representative cross-sectional view of an air gap structure upon which a first oxide precursor has been deposited so as to retain an opening of the air gap according to embodiments of the present disclosure.

FIG. 4 illustrates a representative cross-sectional view of an air gap structure upon which a first oxide precursor has been deposited so as to retain an opening of the air gap according to embodiments of the present disclosure. FIG. 4 illustrates a view of a structure 400 that includes elements corresponding to those described with regard to FIG. 3, upon which a non-conformal oxide precursor material has been deposited.

FIG. 4 differs from FIG. 3 in that the deposition of the non-conformal oxide precursor material 435-1, 435-2 has been stopped at an earlier point in the CVD reactor process. As such, earlier stages of breadloaf configurations 437-1, 437-2, 437-3 formed on the tops 411-1, 411-2, 411-3 of the elevated components 408-1, 408-2, 408-3 and the upper portions of the pairs of opposing sidewalls 409-1, 409-2 retain a space 439-1, 439-2 left between the closest approach of each breadloaf configuration to an adjacent breadloaf configuration 437-1, 437-2, 437-3. In addition, the thickness of the non-conformal oxide precursor layer 435-1. 435-2 can be reduced (e.g., in comparison to FIG. 3) not only in the breadloaf configurations 437-1, 437-2, 437-3, but also upon the pairs of opposing sidewalls 409-1, 409-2 and bottoms 410-1, 410-2 of the lowers portions of the air gaps 432-1, 432-2 of the structure 400 formed on the substrate 405.

Reducing the thickness of the deposited layer of the non-conformal oxide precursor material can allow a space to remain between breadloaf configurations at the top of air gaps, which can enable flow of one or more oxygen-containing gases into the otherwise sequestered air gaps. Enabling the flow of such gases into the air gaps can facilitate, along with an elevated temperature, a more uniform conversion of a Si-rich non-conformal oxide precursor material to an intended oxide dielectric material.

In addition, reducing the thickness of the deposited layer of the non-conformal oxide precursor material, in particular in the lower portions of the air gaps, can facilitate easier access of the oxygen-containing gases into more distal areas of the deposited layer of the non-conformal oxide precursor material (e.g., those areas in contact with the lower portions of the opposing sidewalls and/or the bottom of the air gap). Moreover, as described in the present disclosure, retaining a space at the top of an air gap can enable deposition of a layer of an oxygen-donating material (e.g., a conformal oxide precursor such as TEOS) on top of the potentially Si-rich converted non-conformal $SiO_x$ layer).

By way of example and not by way of limitation, as illustrated in FIG. 3, the thickness of the breadloaf configurations 337-1, 337-2, 337-3 deposited on the tops 311-1, 311-2, 311-3 of the elevated components 308-1, 308-2, 308-3 and upper portions of the pairs of opposing sidewalls 309-1, 309-2 of the air gaps 332-1, 332-2 may be around 1,000 angstroms (Å). Programming, for example, a PECVD reactor to deposit such a thickness of the non-conformal oxide precursor material can, in some situations, cause closure of spaces 338-1, 338-2 between the closest approach of each breadloaf configuration to an adjacent breadloaf configuration 337-1, 337-2, 337-3.

In contrast, as illustrated in FIG. 4, programming, for example, the PECVD reactor to deposit a thickness of 800 Å in the breadloaf configurations 437-1, 437-2, 437-3 deposited on the tops 411-1, 411-2, 411-3 of the elevated components 408-1, 408-2, 408-3 and upper portions of the pairs of opposing sidewalls 409-1, 409-2 of the air gaps 432-1, 432-2 can result in a space 439-1, 439-2 being retained between the closest approach of each breadloaf configuration to an adjacent breadloaf configuration 437-1, 437-2, 437-3. Consequently, for example, by reducing the thickness of each breadloaf configuration (e.g., at 437-1 and 437-2) projecting into an upper portion of an air gap (e.g., at 432-1) by 200 Å, a space (e.g., at 439-1) of 400 Å may be retained between the closest approach of each breadloaf configuration to an adjacent breadloaf configuration (e.g., at 437-1 and 437-2).

Figure 5:
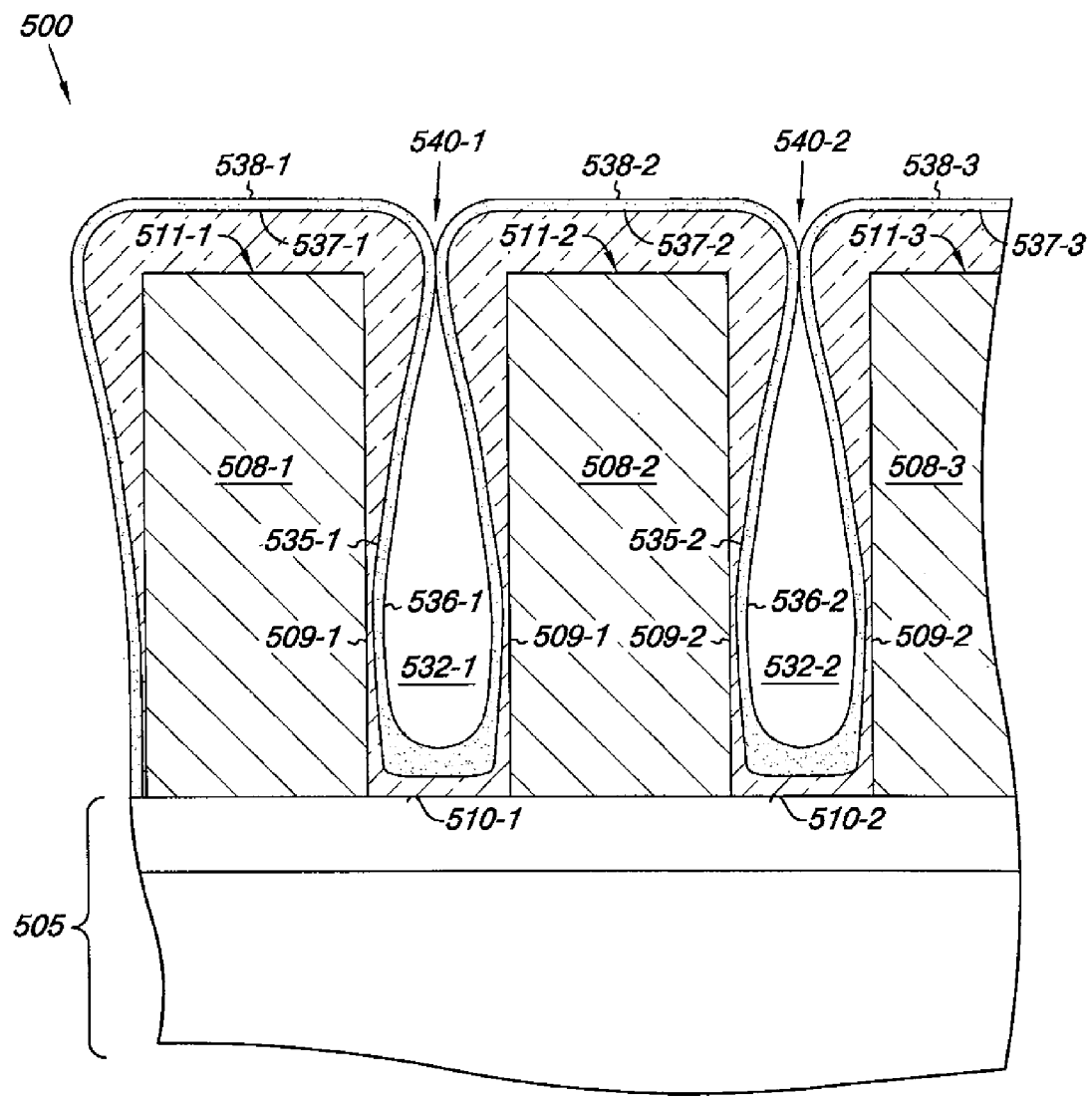
FIG. 5 illustrates a representative cross-sectional view of an air gap structure upon which a second oxide precursor has been deposited over the first oxide precursor so as to close an opening of the air gap according to embodiments of the present disclosure.

FIG. 5 illustrates a representative cross-sectional view of an air gap structure upon which a second oxide precursor has been deposited over the first oxide precursor so as to close an opening of the air gap according to embodiments of the present disclosure. FIG. 5 illustrates a view of a structure 500 that includes elements corresponding to those described with regard to FIG. 4, upon which a second oxide layer 536-1, 536-2 has been deposited over a first oxide layer 535-1, 535-2. In some embodiments, as shown in the structure 500 illustrated in FIG. 5, the first oxide layer 535-1, 535-2 can be formed following deposition of a non-conformal oxide precursor material (e.g., silane, among others) and the second oxide layer 536-1, 536-2 can be formed following deposition of a conformal oxide precursor material (e.g., TEOS, among others).

As described with regard to FIG. 4, a space (e.g., 400 Å) may be retained between the closest approach of each breadloaf configuration to an adjacent breadloaf configuration by, for example, programming a PECVD reactor to deposit a thickness (e.g., 800 Å) of a first oxide precursor layer that does not close the space at the top portion of an air gap. In some embodiments of the present disclosure, in addition to or instead of the space allowing one or more oxygen-containing gases to enter the air gap to promote conversion of a first oxide precursor layer to an intended first oxide dielectric layer, the space can allow a second oxide precursor layer to be deposited over a potentially Si-rich (e.g., $SiO_x$) first oxide layer.

In various embodiments, the second oxide precursor layer can be deposited as a conformal oxide precursor material that can be converted into a second layer of an intended oxide dielectric (e.g., $SiO_2$), which may, in some embodiments, differ from the composition of the first oxide dielectric layer. The second oxide precursor layer can, in some embodiments, serve as an oxygen-donor to the potentially Si-rich (e.g., $SiO_x$) first oxide layer. For example, depositing a conformal oxide precursor material such as TEOS over the structure 500 in FIG. 5 can form a second layer of such material 538-1, 538-2, 538-3 over the existing breadloaf configurations 537-1, 537-2, 537-3 and form a second layer 536-1, 536-2 through open spaces at the top portion of the air gaps 532-1, 532-2. Forming a second layer as such can cause existing spaces at the tops of the air gaps 532-1, 532-2 to be closed 540-1, 540-2 in order to create enclosed air gap voids.

Heating particular conformal oxide precursor materials up to a particularly elevated temperature can cause such materials to release oxygen-containing compounds while also converting the precursor material to an intended second oxide dielectric layer. For example, a layer of TEOS can be formed as a second layer over the non-conformal first oxide layer, as illustrated in FIG. 5. TEOS is a tetrahedral molecule with many analogues having a general formula $Si(OR)_4$, where R can be an alkyl group such as methyl, ethyl, propyl, etc. By way of example, a TEOS analogue having four ethyl groups can have the formula $Si(OC_2H_5)_4$. By exposing $Si(OC_2H_5)_4$ to water ($H_2O$) molecules (e.g., in the form of steam), a hydrolysis reaction can yield a molecule of $SiO_2$ and four molecules of ethanol ($C_2H_5OH$) that contain oxygen as part of the hydroxyl (OH) group. Alternatively, heating $Si(OC_2H_5)_4$ to a temperature of at least 600° C. can yield a molecule of $SiO_2$, two molecules of the volatile co-product diethyl ether[$O(C_2H_5)_2$], and an oxygen molecule ($O_2$).

Hence, depositing a layer of TEOS as a conformal second oxide precursor layer over the potentially Si-rich first oxide layer can serve to both close the space at the top of an air gap to form an enclosed void and also serve as a source of oxygen for converting the Si-rich first oxide layer to a more uniform $SiO_2$ dielectric layer while the TEOS itself is being converted into an intended uniform $SiO_2$ dielectric layer. Converting TEOS into an oxygen donor and a uniform $SiO_2$ dielectric layer can, in various embodiments, be accomplished by exposing the TEOS oxide precursor to $H_2O$ molecules (e.g., in the form of steam) and/or a temperature of at least 600° C.

Figure 6:
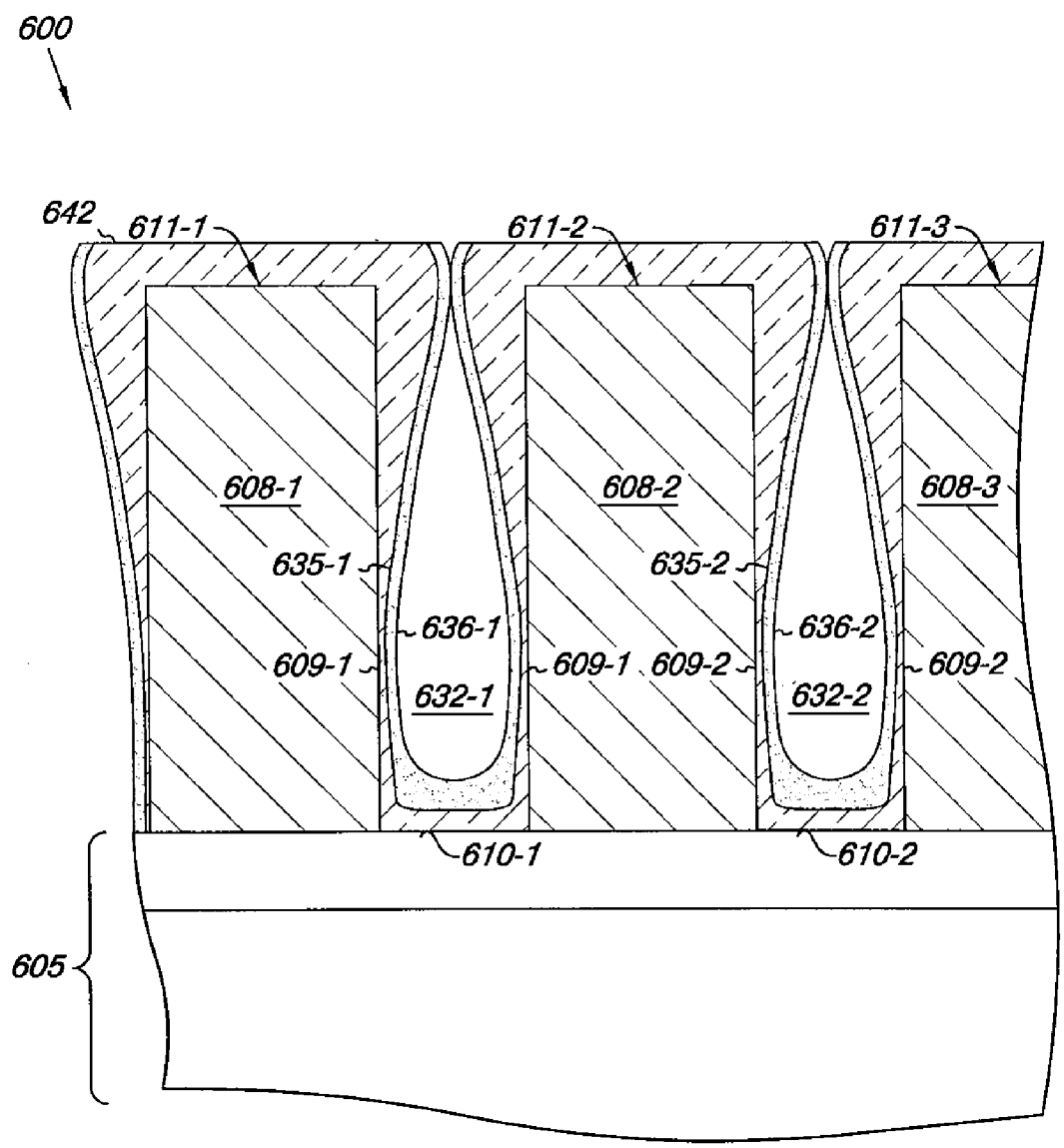
FIG. 6 illustrates a representative cross-sectional view of an air gap structure, such as the air gap structure illustrated in FIG. 5, having an upper surface of closed openings substantially leveled to a plane according to embodiments of the present disclosure.

FIG. 6 illustrates a representative cross-sectional view of an air gap structure, such as the air gap structure illustrated in FIG. 5, having an upper surface of closed openings substantially leveled to a plane according to embodiments of the present disclosure. FIG. 6 illustrates a view of a structure 600 that includes elements corresponding to those described with regard to FIG. 5.

FIG. 6 shows that the uppermost portions of the second oxide layer 538-1, 538-2, 538-3 and the breadloaf configurations 537-1, 537-2, 537-3 shown in FIG. 5 have been leveled (e.g., removed) to achieve a planar configuration 642. For example, chemical-mechanical polishing, as appreciated by one of ordinary skill in the relevant art, may be used to planarize the structure 600 achieved by air gap processing described in the present disclosure. Among various uses, leveling structures as described in the disclosure can be used to facilitate formation of levels of components for multi-level integrated circuits.

Figure 7:
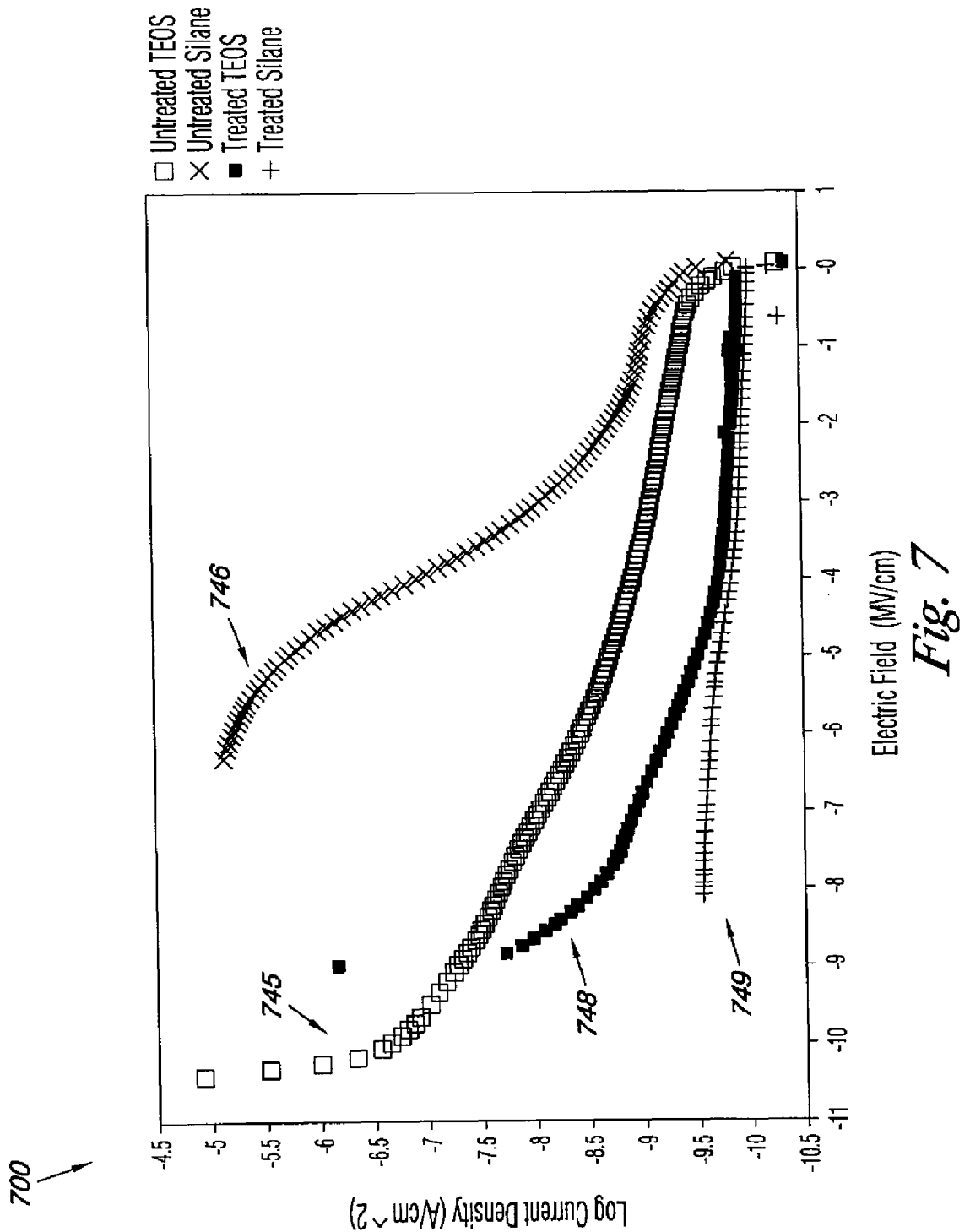
FIG. 7 illustrates a graphical comparison of current leakage of untreated versus treated oxides deposited by non-conformal and conformal oxide precursor materials according to embodiments of the present disclosure.

FIG. 7 illustrates a graphical comparison of current leakage of untreated versus treated oxides deposited by non-conformal and conformal oxide precursor materials according to embodiments of the present disclosure. FIG. 7 illustrates a graph 700 obtained using data from a metal oxide semiconductor (MOS) capacitor, as appreciated by one of ordinary skill in the relevant art, to measure current leakage through particular oxides before and after treatments as described in the present disclosure. The vertical axis of the graph 700 provides a measure of a log of a current density (amperes/square centimeter) plotted against the horizontal axis, which provides a measure of an applied electrical field (millivolts/centimeter).

As illustrated in FIG. 2B, non-conformal oxides may be deposited on sidewalls and bottoms of air gaps. As the oxide precursor becomes more conformal, greater thicknesses of oxide are deposited in the lower portion of the air gaps, as illustrated in FIG. 2A. Using a non-conformal oxide precursor (e.g., silane) that results in a lesser thickness of oxide deposited in the lower portion of the air gaps can provide better void formation, which may lead to lower capacitance in the air gaps. However, more non-conformal oxide precursors such as silane can have elevated current leakage levels, for example, when deposited by PECVD, because of the Si-rich $SiO_x$ mixture in the oxide layer resulting from untreated silane compared to a conformal oxide precursor such as TEOS after undergoing conversion to $SiO_2$. Oxides that are "leaky" can be a conduit for current leakage between, for example, interconnect lines, in particular through air gaps placed therebetween.

The graph 700 in FIG. 7 illustrates that an approximately 1150 Å thick layer of untreated TEOS at 745 (e.g., after heat conversion to $SiO_2$) shows notably less current leakage than an approximately 850 Å thick layer of untreated silane at 746. After treatment, for example, by in situ steam generation (ISSG) in the presence of $O_2$ and elevated temperature (e.g., furnace annealing), a treated TEOS layer at 748 shows even less current leakage than the untreated silane layer at 746 and even the untreated TEOS layer at 745. Of particular note, an approximately 850 Å thick treated silane layer at 749 shows markedly less current leakage than the untreated silane layer it 746, and less current leakage than even the approximately 1150 Å thick layers of untreated TEOS at 745 and treated TEOS at 748.

Hence, as illustrated in graph 700, untreated oxides can allow greater levels of current leakage relative to oxides treated, for example, with ISSG. In addition, non-conformal oxides, such as silane deposited by a PECVD reactor, can be notably more leaky than a conformal oxide, such as TEOS, but the current leakage of non-conformal oxides can be markedly reduced by treatment, such as annealing with ISSG in the presence of oxygen in an annealing furnace step. Moreover, graph 700 shows that, in some situations, a treated layer of non-conformal oxide (e.g., silane) can have a lower current leakage than an untreated or treated conformal oxide layer (e.g., TEOS) that is thicker than the treated silane layer.

As described in the present disclosure, an alternative treatment modality for silane can be performed by depositing an oxygen-donating layer of a conformal oxide precursor (e.g., TEOS) on top of an already deposited layer of non-conformal potentially Si-rich oxide, and converting the conformal oxide precursor to an oxide by exposure to an elevated temperature that releases oxygen in close vicinity to the non-conformal potentially Si-rich oxide (e.g., a furnace oxide deposition step). In various embodiments of the present disclosure, depositing only enough oxide precursor material to retain a space at the top of each air gap in order to allow exposure to gases in the environs and/or deposition of a second layer of oxide precursor material can be performed using a non-conformal precursor first and a conformal precursor second, a conformal precursor first and a non-conformal precursor second, a non-conformal precursor first and a non-conformal precursor second, or a conformal precursor first and a conformal precursor second.

According to embodiments of the present disclosure, tools including apparatuses and devices can be used for chemical vapor deposition (CVD) and/or exposure to an environs with elevated temperature. Such apparatuses and devices can be used to perform various techniques that include high-density plasma chemical vapor deposition (HDP-CVD), plasma-enhanced chemical vapor deposition (PECVD), high pressure liquid injection metalorganic chemical vapor deposition (HP-MOCVD), hot-wall reduced pressure liquid-injection atomic layer deposition (ALD), ultra-high-vacuum molecular-beam epitaxy (MBE) using e-beam evaporation, high vacuum sputtering, in situ steam generation (ISSG), furnace annealing, and furnace oxide deposition, among others, some of which are described below in connection with FIGS. 8 and 9 by way of example and not by way of limitation.

Figure 8:
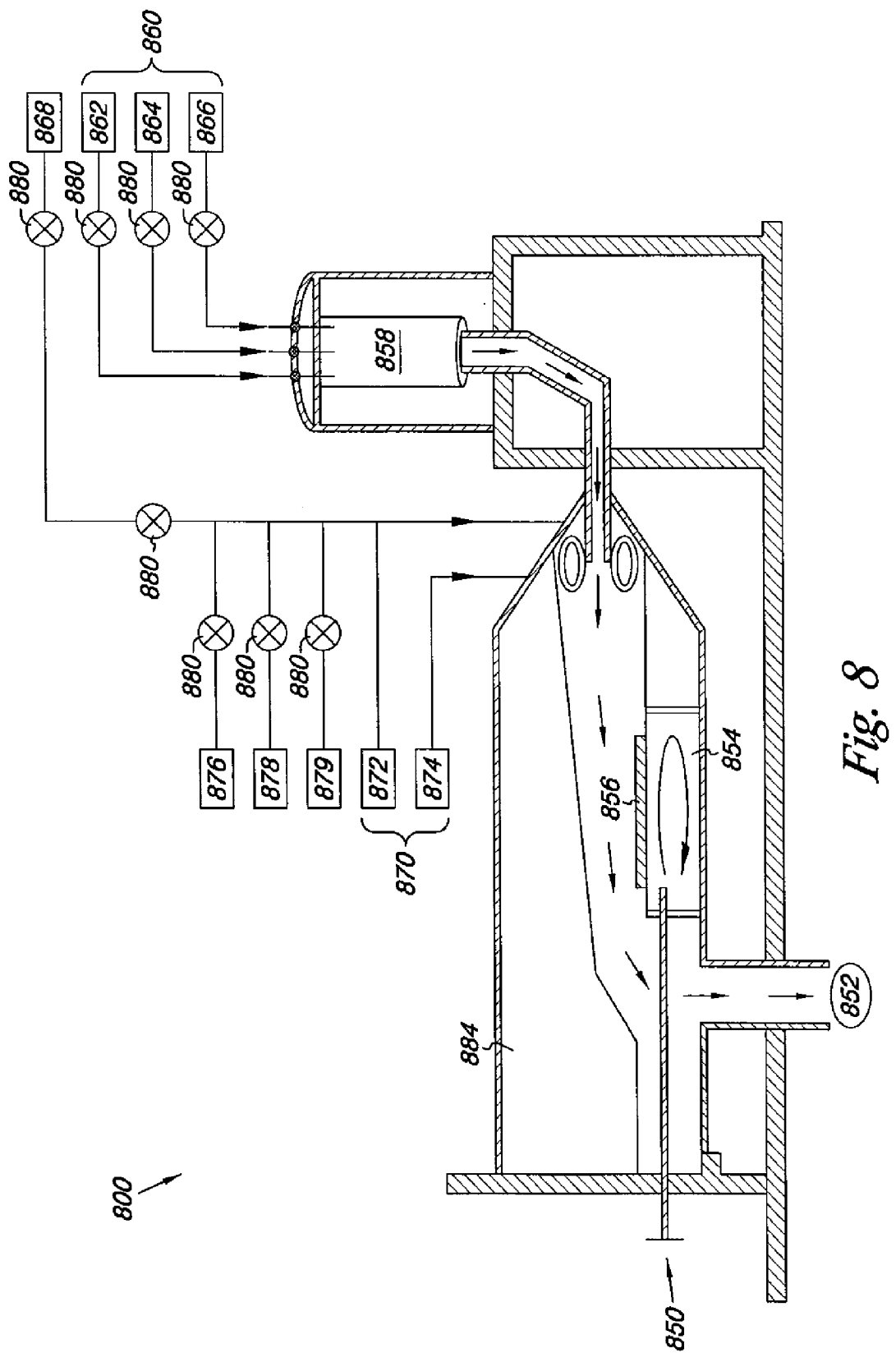
FIG. 8 illustrates a representative chemical vapor deposition reactor that can be used in accordance with embodiments of the present disclosure.

FIG. 8 illustrates a representative chemical vapor deposition reactor that can be used in accordance with embodiments of the present disclosure. The elements depicted permit discussion of the present disclosure such that those skilled in the art may practice the present disclosure without undue experimentation. In FIG. 6, a target 856 (e.g., a substrate having interconnect lines with air gaps between the interconnect lines) can be located inside a reaction chamber 884 of a CVD reactor 800. Also located within the reaction chamber 884 can be a heated rotary stage 854, which can be thermally coupled to target 856 to control the target temperature. A vaporizer 858 (e.g., a plasma generator) can introduce dielectric precursors (e.g., oxide precursor material) to the target 856. Each dielectric precursor can originate from sources 860, including sources 862, 864, 866, and also 868, whose flow can be controlled by mass-flow controllers 880. Sources 860 can provide precursors by providing a liquid material to form the selected precursor gas in vaporizer 858.

Also included in the CVD reactor 800 can be purging gas sources 870 including 872 and 874. Furthermore, additional purging gas sources can be constructed in CVD reactor 800, one purging gas source for each dielectric precursor gas, for example. For a process that uses the same purging gas for multiple precursor gases, less purging gas sources are required for the CVD reactor system 800. The CVD reactor 800 also can include gas sources 876, 878, and 879 for introduction to reaction chamber 884 without needing to be vaporized, for example, to plasma, at 858 (e.g., as in ISSG). Reaction chamber 884 also can be coupled to vacuum pump, or exhaust pump, 852, after thermocouple 850, to remove excess dielectric precursor gases, purging gases, and by-product gases at the end of a purging sequence from the reaction chamber 884.

For convenience, control displays, mounting apparatus, temperature sensing devices, substrate maneuvering apparatus, and necessary electrical connections, as appreciated by those skilled in the art, are not shown in FIG. 8. Although a CVD reactor as illustrated in FIG. 8 is suitable for practicing the present disclosure, other CVD reactor configurations can be used.

The use, construction and fundamental operation of CVD reaction chambers for deposition of films are understood by those of ordinary skill in the art of integrated circuits and/or semiconductor fabrication. The present disclosure may be practiced on a variety of such reaction chambers without undue experimentation. Furthermore, one of ordinary skill in the art will comprehend the necessary detection, measurement, and control techniques in the art of integrated circuits and/or semiconductor fabrication upon reading the present disclosure.

The elements of a CVD reactor 800 as illustrated in FIG. 8 can be controlled by a medium having instructions stored thereon for executing performance of processes performed by the CVD reactor. For example, such instructions can, in various embodiments, be stored in hardware (e.g., an application-specific integrated circuit), firmware, and/or software memory and, in some embodiments, be executed by a processor (e.g., of a computer). To focus on the use of CVD reactor 800 in the various embodiments of the present disclosure, such apparatuses for storing and/or executing instructions are not shown. Those skilled in the art can appreciate that the individual elements such as pressure control, temperature control, and gas/plasma flow within CVD system 800 can be under control of such apparatuses.

The CVD reactor 800 can be used to form a first oxide precursor material layer (e.g., at 437 and 537 as described above in connection with FIGS. 4 and 5) for example, a first silicon oxide precursor. In some embodiments, formation can be performed after some preliminary steps. For example, appropriate temperature degassing of the reaction chamber 884 can be performed (e.g., pre-baking at 450° C. in an ultra-pure nitrogen environment to help provide complete desorption of hydrogen and moisture for a relatively contamination-free surface of a number of interconnect lines and bottom surfaces prior to deposition of the first silicon oxide precursor). Furthermore, pre-cleaning of a target 856, interface oxidation, and/or in-situ vapor-phase removal of native oxide from the surface of the target 856 can be performed prior to deposition of the first oxide precursor.

Figure 9:
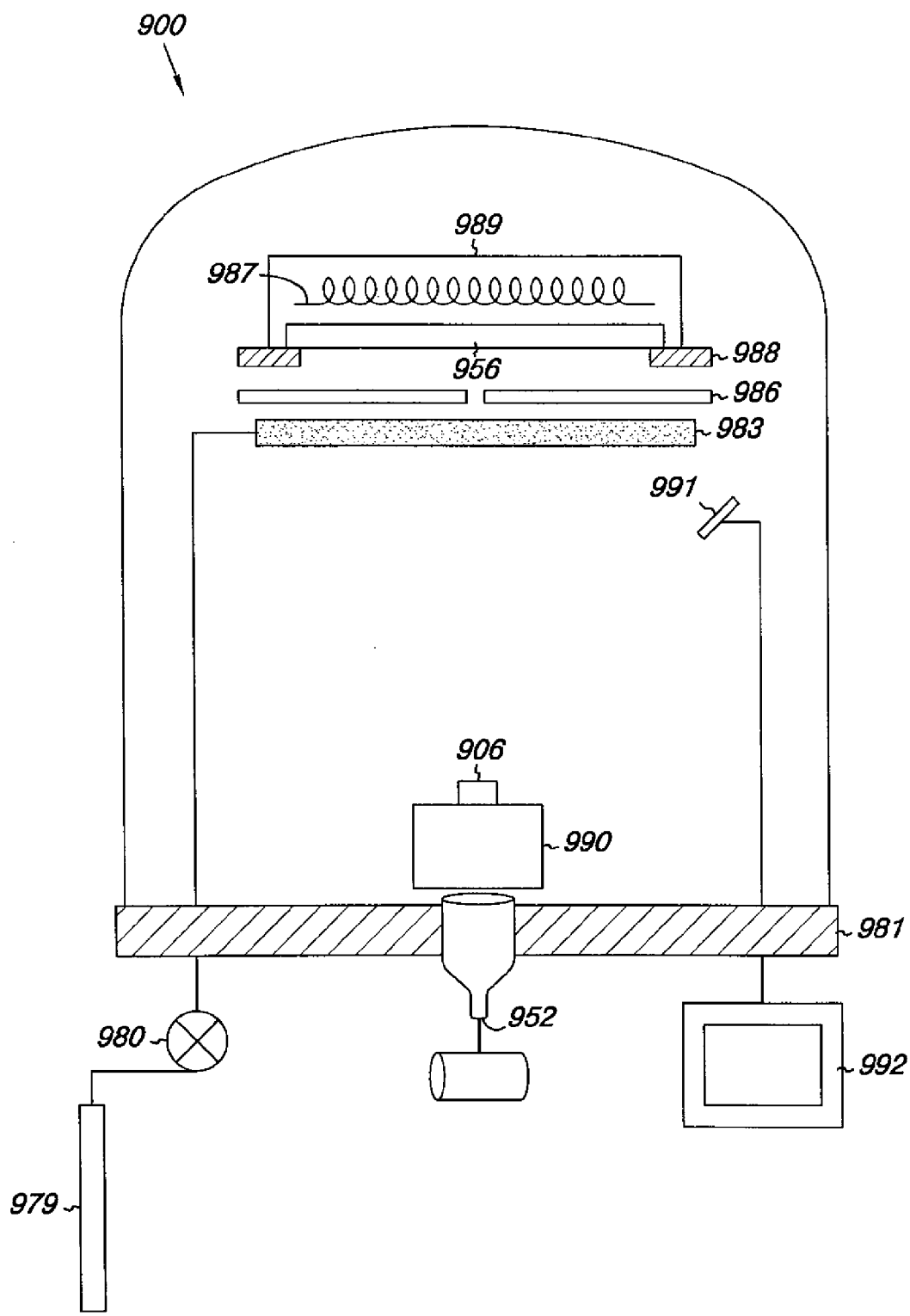
FIG. 9 illustrates a representative vessel for application of an elevated temperature that can be used in accordance with embodiments of the present disclosure.

FIG. 9 illustrates a representative vessel for application of an elevated temperature that can be used in accordance with embodiments of the present disclosure. The vessel 900 is shown in FIG. 9 as an apparatus separate from the CVD reactor 800 illustrated in FIG. 8 for purposes of clarity of presentation of the elements shown. However, in some embodiments, the CVD reactor 800 and the vessel 900 can be combined into a single apparatus and remain consistent with the present disclosure.

The vessel 900 illustrated in FIG. 9 can, in some embodiments, be located on top of a base plate 981. A target 956 (e.g., a substrate having interconnect lines with air gaps between the interconnect lines) can include a previously deposited precursor dielectric (e.g., a silicon-containing oxide precursor material) and/or at least some converted dielectric (e.g., a precursor converted to silicon dioxide). The target 956 can be held in a substrate support device 988 with the target surface facing a shutter 986 that controls exposure of the substrate surface to, for example, a source of oxygen-containing gas 906 (e.g., $O_2$, $N_2O$, and $CO_2$, among others). The source of oxygen-containing gas 906 can, in some embodiments, be emitted after having its temperature elevated by a heater 990 situated in the lower part of the chamber below the shutter 986.

The temperature of the target 956 and the vessel 900 environs can be controlled by a heater assembly 987 that can, in some embodiments, include an optional reflector 989 in close proximity to the target 956. A distribution ring 983 can be located below the shutter 986. The distribution ring 983 can be a manifold that distributes oxygen-containing gas around the surface of the target 956, at a range of pressures appropriate for the purpose to be accomplished. The vessel 900 can be configured with a vacuum pump 952 for evacuating the chamber to a pressure of about 10 E-6 torr (i.e., about 10 E-6 millimeters of mercury) or less. Oxygen and/or oxygen containing gas pressures in the chamber can be regulated by a control regulator 980.

A particular pressure of oxygen and/or oxygen-containing gas may, in some embodiments, be used in the chamber to facilitate the precursor dielectric (e.g., a silicon-containing oxide precursor material) and/or at least some converted dielectric (e.g., a precursor converted to silicon dioxide) becoming more uniformly oxidized because the preceding processes (e.g., deposition of silane-family oxide precursors) tend to yield a mixture of oxidation stoichiometries (i.e., a silicon-rich $SiO_x$). Optional detectors and/or monitors may be included on the interior or exterior of the vessel 900, such as an interiorly situated detector 991 for detecting a thickness of a deposited layer (e.g., by way of example and not by way of limitation, a non-conformal first oxide precursor material, and a conformal second oxide precursor material) and the exteriorly situated monitor 992 for displaying the thickness of the layer and/or a lead connected to a memory apparatus for executing control over performance of processing (not shown). Dielectric layers can be formed to a range of suitable thicknesses (e.g., from approximately 5 Å to about 2000 Å by controlling duration of vapor deposition.

A CVD reactor, in various embodiments, can be operated by depositing a non-conformal first oxide precursor material using PECVD on at least two conductive lines having at least one gap between the at least two conductive lines, where each conductive line can have a top and at least one sidewall and each gap can have a bottom of a particular depth separating sidewalls of the two conductive lines. The CVD reactor can be operated by, in various embodiments, forming a breadloaf configuration with the non-conformal first oxide precursor material on a top of each of the at least two conductive lines that leaves a space between the closest approach of adjacent breadloaf configurations. Additionally, the CVD reactor can be operated by, in various embodiments, depositing a conformal second oxide precursor material on the at least two conductive lines, where depositing the second oxide precursor material can result in closing the space between the closest approach of the at least two adjacent breadloaf configurations.

In various embodiments, the CVD reactor can be operated by depositing a conformal second oxide precursor material containing oxygen in a molecular structure of the conformal second oxide precursor material. For example, the conformal second oxide precursor material can be TEOS. In some embodiments, depositing the conformal second oxide precursor material can include heating the conformal second oxide precursor material to a temperature high enough to cause thermal decomposition of the conformal second oxide precursor material. Heating the conformal second oxide precursor material can, in some embodiments, include converting the conformal second oxide precursor material into a substantially uniform silicon dioxide layer. For example, heating TEOS to at least 600° C. can cause thermal decomposition of TEOS to yield $SiO_2$ and $O_2$, in addition to diethyl ether.

In various embodiments, the CVD reactor can be operated by causing at least some of a residual silicon-rich first oxide deposited by the non-conformal first oxide precursor material around the bottom and adjacent sidewalls of each gap to shift to a more uniform silicon dioxide layer. For example, the thermal decomposition of TEOS can release $O_2$, which can cause at least some of the residual silicon-rich first oxide deposited by the non-conformal first oxide precursor material (e.g., silane) to incorporate oxygen into the oxide stoichiometry in order to shift to a more uniform silicon dioxide in the first deposited oxide layer.

In various embodiments, the CVD reactor can be operated by depositing the conformal second oxide precursor material and using ISSG to convert the conformal second oxide precursor material into a substantially uniform silicon dioxide layer. In some embodiments, causing at least some of a residual silicon-rich first oxide deposited by the non-conformal first oxide precursor material around the bottom and adjacent sidewalls of each gap to shift to a more uniform silicon dioxide layer.

Processing an air gap, as described in the present disclosure, can include, by way of example and not by way of limitation, using a PECVD reactor for deposition of a first oxide precursor, such as the non-conformal silane. Examples of such reactors are various models of the Novellus VECTOR® PECVD platform. In embodiments of the present disclosure, a PECVD reactor can provide, for example, silane plasma at a gas volumetric flow rate of around 450 standard cubic centimeters per minute (sccm) to gaps in a structure having a width of around 350 Å (e.g., width of gaps between interconnect lines). The silane, for example, can be provided in the reaction chamber at a pressure from around 1.0 torr to around 5.0 torr and using a radio frequency (RF) power of around 2200 Watts. In order to promote conversion of the first oxide precursor material (e.g., silane) to a first oxide material, an oxygen-containing gas (e.g., $N_2O$) can be introduced into the reaction chamber at a flow rate of around 1800 seem.

Deposition times can, in various embodiments, be modulated to achieve particular deposition thicknesses at desired stages of breadloafing. By way of example and not by way of limitation, to achieve incomplete breadloafing (e.g., to enable further processing of air gaps to lower current leakage between interconnect lines), as illustrated in FIG. 4 and as described in the present disclosure, the first oxide precursor (e.g., the non-conformal silane) can be deposited as just described for around 27 seconds in order to provide a deposition thickness of around 800 Å, as measured on a flat wafer. To achieve complete breadloafing (e.g., which would prevent further processing of air gaps to lower current leakage between interconnect lines), as illustrated in FIG. 3 and as described in the present disclosure, the first oxide precursor (e.g., the non-conformal silane) can be deposited for around 34 seconds in order to provide a deposition thickness of around 1000 Å, as measured on a flat wafer.

When the first oxide deposition does not result in closing a space between adjacent breadloaf configurations at the top of an air gap, as illustrated in FIG. 4, a second oxide precursor can be deposited, as illustrated in FIG. 5. By way of example and not by way of limitations, a furnace oxide deposition step can be performed with conformal TEOS at around 655° C. and at low pressure (e.g., at around 600 milli-torr) to accomplish thermal decomposition of the deposited TEOS. Deposition of conformal second oxide precursors, in various embodiments, can be performed at pressures from about 1 milli-torr to about 760 torr (i.e., atmospheric pressure of 760 mmHg). The thermal decomposition of TEOS can provide a source for both $SiO_2$ for a second layer of oxide dielectric material and oxygen to affect the stoichiometry of residual Si-rich $SiO_x$ oxide from the first oxide deposition near the lower portion of the sidewalls and bottom of the air gaps. Deposition of the second oxide precursor and thermally decomposing the second oxide precursor to form a second oxide layer can be performed to close the space between the breadloaf configurations at the top of the air gaps.

In some embodiments of air gap processing, for example, ISSG can be performed as a furnace annealing step in the presence of $O_2$ and elevated temperature to create an in situ steam environs of around 950° C. in the reaction chamber. For example, depositing the conformal second oxide precursor material (e.g., TEOS) and using ISSG to convert the conformal second oxide precursor material into a substantially uniform silicon dioxide layer can cause at least some of a residual Si-rich first oxide deposited by the non-conformal first oxide precursor material (e.g., silane) around the bottom and adjacent sidewalls of each gap to shift to a more uniform silicon dioxide layer by providing oxygen from the thermal decomposition of the conformal second oxide precursor and/or by directly providing oxygen to the residual Si-rich first oxide by reaction with the steam and oxygen.

FIG. 10 is a block diagram illustrating forming a gap between circuitry according to method embodiments of the present disclosure. Unless explicitly stated, the method embodiments described herein are not constrained to a particular order or sequence. Additionally, some of the described method embodiments, or elements thereof, can occur or be performed at the same, or at least substantially the same, point in time.

The embodiment illustrated in FIG. 10 includes depositing a first oxide precursor material on at least two conductive lines having at least one gap between the at least two conductive lines, as shown at block 1094. In some embodiments, the gap can be used as an air gap between conductive lines and, in some embodiments, the gap can eventually become filled with layers of precursor dielectric (e.g., oxide) material that become intended dielectric (e.g., oxide) material, as described in the present disclosure. In some embodiments, the at least two conductive lines can be at least two interconnect lines associated with one or more integrated circuits. In some embodiments, the at least two conductive lines can be at least two conductive lines associated with various types of electronic circuitry.

As shown in block 1096, a breadloaf can be formed with the first oxide precursor material on a top of each of the at least two conductive lines that leaves a space between a closest approach of at least two adjacent breadloaf configurations. The space between the closest approach of at least two adjacent breadloaf configurations can, in various embodiments, be utilized for allowing access of one or more gases into an interior of an associated gap void and/or allowing access of one or more additional layers of oxide precursor materials (which can differ from each other) to be deposited in the interior of the associated gap void, in the environs of, for example, various types of CVD reactors.

Block 1098 shows that a second oxide precursor material can be deposited over the first oxide precursor material, where depositing the second oxide precursor material results in closing the space between the closest approach of the at least two adjacent breadloaf configurations. In various embodiments, closing the space between the closest approach of the at least two adjacent breadloaf configurations can be performed after the interior of the gap void has been sufficiently exposed to the one or more gases to promote converting the first and/or the second oxide precursor material into an intended dielectric oxide material and/or after the interior of the gap void has been sufficiently exposed to the one or more additional layers of oxide precursor materials to be deposited in the interior of the associated gap void.

In some embodiments, depositing the first oxide precursor material can include depositing a first oxide material having varying stoichiometries in oxygen content of molecules contributing to the first oxide material. For example, the first oxide material can be derived from a non-conformal oxide precursor material that lacks oxygen and which forms a Si-rich mixture such as $SiO_x$, where the x value can indicate a mixture of silicon molecules having no oxygen (i.e., pure silicon), one oxygen atom (i.e., SiO), or two oxygen atoms (i.e., the intended SiO$_2$ molecule).

In various embodiments, a particular activity can be performed to change a stoichiometry of at least some of the deposited first oxide material after forming the breadloaf configuration. In some embodiments, performing the particular activity to change the stoichiometry can include decreasing a relative dielectric constant of the first oxide material by changing relative oxygen content of at least some molecules contributing to the first oxide material. For example, changing relative oxygen content of at least some molecules contributing to the first oxide material can be accomplished by exposing the first oxide material to one or more oxygen-containing gases, in some instances in the presence of an elevated temperature, and/or depositing an oxygen-donor second oxide precursor material over the first oxide material, as described in the present disclosure.

In various embodiments, at least two adjacent conductive lines can be used that each have a top and sidewalls, where each gap can have a bottom between sidewalls of the adjacent conductive lines, and where a particular distance can separate the top of each conductive line and the bottom of an adjacent gap. In some embodiments, a non-conformal first oxide precursor material can be deposited to form a thicker deposit of a first oxide material around the top and adjacent sidewalls of the at least two adjacent conductive lines compared to a thickness around the bottom and the adjacent sidewalls of the gap.

In some embodiments, a conformal second oxide precursor material can be deposited over the first oxide material to close the space between the closest approach of the at least two adjacent breadloaf configurations. Depositing the second oxide precursor material can include depositing a conformal oxide precursor material over the first oxide material to form a layer of a second oxide material around the bottom and adjacent sidewalls of the gap.

Various systems incorporating a number of elements of the present disclosure in various configurations may be utilized. In various embodiments, the memory device can store instructions on hardware (e.g., an application-specific integrated circuit), firmware, and/or software memory to be executed, in some embodiments, by a processor (e.g., of a computer). By way of example and not by way of limitation, embodiments of the present disclosure can be utilized in a processor-based system that includes, among other components, a processor and a memory device coupled to the processor.

The memory device can, in various embodiments, include a memory structure, where the memory structure includes instructions for executing performance of depositing a first oxide precursor material on at least two conductive lines having at least one gap separating sidewalls of two adjacent conductive lines, where each conductive line has a top and at least one sidewall and each gap has a bottom of a particular depth separating sidewalls of the two conductive lines. In some embodiments, such gaps can be used as air gaps between conductive lines and, in some embodiments, the gaps can eventually become filled with layers of precursor dielectric (e.g., oxide) material that become intended dielectric (e.g., oxide) material, as described in the present disclosure.

The memory structure can, in various embodiments, also include instructions for executing performance of forming a breadloaf configuration with the first oxide precursor material on the top of each of the two adjacent conductive lines that leaves a space between the closest approach of the two adjacent breadloaf configurations. Additionally, the memory structure can, in various embodiments, also include instructions for executing performance of depositing a second oxide precursor material on the two adjacent conductive lines, where depositing the second oxide precursor material results in closing the space between the closest approach of the two adjacent breadloaf configurations.

In some embodiments, a second oxide precursor material can be deposited that is selected from oxide precursor materials having essentially different molecular compositions compared to the first oxide precursor material. For example, a first oxide precursor can be selected from silicon compositions lacking oxygen and a second oxide precursor can be selected from silicon compositions containing oxygen. In some embodiments, the first oxide precursor to be used can be selected from silicon compositions lacking oxygen, which includes using silanes. In some embodiments, the second oxide precursor to be used can be selected from silicon compositions containing oxygen, which includes using TEOS.

In various embodiments, a first oxide layer formed from molecules contributed by the first oxide precursor can be exposed to an oxygen-containing plasma to shift a silicon-rich mixture of the first oxide layer toward a more uniform silicon dioxide mixture. In some embodiments, exposing the first oxide layer to the oxygen-containing plasma can include exposing the first oxide layer before the space between the closest approach of the two adjacent breadloaf configurations is closed.

In various embodiments, a first oxide layer formed from molecules contributed by the first oxide precursor can be exposed to an oxygen-containing gas and a temperature high enough to shift a silicon-rich mixture of the first oxide layer toward a more uniform silicon dioxide mixture. In some embodiments, exposing the first oxide layer to the oxygen-containing gas and the high temperature can include exposing the first oxide layer before the space between the closest approach of the two adjacent breadloaf configurations is closed.

In various embodiments, depositing the second oxide precursor material can include depositing the second oxide precursor material that is selected from oxide precursor materials having essentially a same molecular composition as the first oxide precursor material. In some embodiments, both the first and second oxide precursor materials can be selected from a same group, where the groups consist of conformal oxide precursor materials and non-conformal oxide precursor materials.

Although specific embodiments have been illustrated and described herein, those of ordinary skill in the relevant art will appreciate that an arrangement calculated to achieve the same results can be substituted for the specific embodiments shown. This disclosure is intended to cover all adaptations or variations of various embodiments of the present disclosure.

Reference is made to various specific embodiments in which the disclosure may be practiced herein. These embodiments are described with sufficient detail to enable those skilled in the art to practice the disclosure. It is to be understood, however, that changes may be implemented to structural, logical, and electrical components to achieve the same results and still remain within the teachings of the present disclosure.

It is to be further understood that the above description has been made in an illustrative fashion, and not a restrictive one. Combination of the above embodiments, and other embodiments not specifically described herein, will be apparent to those of ordinary skill in the relevant art upon reviewing the above description.

The applicability of the various embodiments of the present disclosure includes other applications in which the above structures, devices, systems, and methods are used, for example, in implementations other than computer systems. Therefore, the applicability of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure need to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

We claim:

1. A method, comprising:
    forming a non-conformal first oxide precursor material on a number of conductive lines each having a gap therebetween with a top, a bottom, and sidewalls that separate the number of conductive lines such that a space remains between the sidewalls that form the top of at least one gap;
    closing the space that remains between the sidewalls that form the top of the at least one gap by forming a conformal second oxide precursor material on the non-conformal first oxide precursor material; and
    converting, after closing the space, at least some of the non-conformal first oxide precursor material in the at least one gap to a uniform silicon dioxide material by reacting with at least one oxygen-containing compound released by heating the conformal second oxide precursor material.

2. The method of claim 1, wherein the method includes forming a conformal second oxide precursor material containing oxygen in a molecular structure of the conformal second oxide precursor material.

3. The method of claim 1, wherein heating the conformal second oxide precursor material includes heating the conformal second oxide precursor material to a temperature high enough to cause thermal decomposition of the conformal second oxide precursor material and to cause release of the at least one oxygen-containing compound after forming the conformal second oxide precursor material and closing the space.

4. The method of claim 1, wherein heating the conformal second oxide precursor material includes converting the conformal second oxide precursor material into a substantially uniform silicon dioxide layer.

5. The method of claim 4, wherein the method includes causing at least some of a residual silicon-rich first oxide formed by the non-conformal first oxide precursor material around the bottom and adjacent sidewalls of the at least one gap to shift toward a uniform silicon dioxide layer.

6. The method of claim 2, wherein forming the conformal second oxide precursor material includes using in situ steam generation to convert the conformal second oxide precursor material into a substantially uniform silicon dioxide layer.

7. The method of claim 6, wherein the method includes causing at least some of a residual silicon-rich first oxide formed by the non-conformal first oxide precursor material around the bottom and adjacent sidewalls of the at least one gap to shift toward a uniform silicon dioxide layer.

8. A method, comprising:
    forming a first oxide precursor material on at least two conductive lines having at least one gap therebetween with a top, a bottom, and sidewalls that separate the at least two conductive lines such that a space remains between the sidewalls that form the top of the at least one gap;
    closing the space that remains between the sidewalls by forming a second oxide precursor material over the first oxide precursor material; and
    converting, after closing the space, at least some of the first oxide precursor material formed around the bottom and adjacent sidewalls of the at least one gap to a uniform silicon dioxide material by reacting with at least one oxygen-containing compound released by heating the second oxide precursor material.

9. The method of claim 8, wherein forming the first oxide precursor material includes forming a first oxide material having varying stoichiometries in oxygen content of molecules contributing to the first oxide material.

10. The method of claim 9, wherein the method includes performing a particular activity to change a stoichiometry of at least some of the deposited first oxide material after closing the space.

11. The method of claim 10, wherein performing the particular activity to change the stoichiometry includes decreasing a relative dielectric constant of the first oxide material by changing relative oxygen content of at least some molecules contributing to the first oxide material.

12. The method of claim 8, wherein the method includes using at least two adjacent conductive lines each having a top and sidewalls, wherein the at least two adjacent conductive lines each have a gap therebetween having a bottom between sidewalls of the adjacent conductive lines, and wherein a particular distance separates the top of each conductive line and the bottom of an adjacent gap.

13. The method of claim 12, wherein the method includes forming a non-conformal first oxide precursor material to form a thicker deposit of a first oxide material around the top and adjacent sidewalls of the at least two adjacent conductive lines compared to a thickness around the bottom and the adjacent sidewalls of the gap.

14. The method of claim 13, wherein the method includes forming a conformal second oxide precursor material over the first oxide material to close the space between a closest approach of the adjacent sidewalls.

15. The method of claim 14, wherein forming the second oxide precursor material includes depositing a conformal oxide precursor material over the first oxide material to form a second oxide material around the bottom and adjacent sidewalls of the gap.

16. A method, comprising:
    forming a first oxide precursor material on at least two conductive lines having at least one gap separating sidewalls of two adjacent conductive lines, wherein each conductive line has a top and at least one sidewall and each gap has a bottom, such that a space remains between the sidewalls that form the top of the at least one gap;
    closing the space that remains between the sidewalls that form the top of the at least one gap by forming a second oxide precursor material over the first oxide precursor material; and
    converting at least some of a silicon-rich first oxide precursor material formed around the bottom and adjacent sidewalls of each gap to a uniform silicon dioxide material by reacting with at least one oxygen-containing compound.

17. The method of claim 16, wherein the method includes forming a second oxide precursor material selected from oxide precursor materials having essentially different molecular compositions compared to the first oxide precursor material.

18. The method of claim 16, wherein the method includes using a first oxide precursor selected from silicon compositions lacking oxygen and using a second oxide precursor selected from silicon compositions containing oxygen.

19. The method of claim 18, wherein using the first oxide precursor selected from silicon compositions lacking oxygen includes using silanes.

20. The method of claim 18, wherein using the second oxide precursor selected from silicon compositions containing oxygen includes using tetraethyl orthosilicate.

21. The method of claim 18, wherein the method includes exposing the first oxide precursor to an oxygen-containing plasma to convert a silicon-rich mixture of the first oxide precursor toward a uniform silicon oxide mixture.

22. The method of claim 21, wherein exposing the first oxide precursor to the oxygen-containing plasma includes exposing the first oxide precursor before the space between the sidewalls that form the top of the at least one gap is closed.

23. The method of claim 18, wherein the method includes exposing a first oxide layer formed from molecules contributed by the first oxide precursor to an oxygen-containing gas and a temperature high enough to convert a silicon-rich mixture of the first oxide layer toward a uniform silicon dioxide mixture.

24. The method of claim 23, wherein exposing the first oxide layer to the oxygen-containing gas and the high temperature includes exposing the first oxide layer before the space between the sidewalls that form the top of the at least one gap is closed.

25. The method of claim 16, wherein forming the second oxide precursor material includes forming the second oxide precursor material selected from oxide precursor materials having essentially a same molecular composition as the first oxide precursor material.

26. The method of claim 25, wherein the method includes selecting both the first and second oxide precursor materials from a same group, and wherein a first group consists of conformal oxide precursor materials and a second group consists of non-conformal oxide precursor materials.

* * * * *